(12) United States Patent
Dohata

(10) Patent No.: US 6,459,339 B1
(45) Date of Patent: Oct. 1, 2002

(54) HIGH-FREQUENCY CIRCUIT

(75) Inventor: Hiroyuki Dohata, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/985,895

(22) Filed: Nov. 6, 2001

(30) Foreign Application Priority Data

Nov. 24, 2000 (JP) ........................................ 2000-357123

(51) Int. Cl.[7] ................................................. H03F 3/60
(52) U.S. Cl. ...................... 330/286; 330/307; 333/125; 257/758
(58) Field of Search ................................. 330/286, 295, 330/307, 214 R; 333/125, 128, 136, 247; 257/758, 794, 796, 728

(56) References Cited

U.S. PATENT DOCUMENTS

| 4,647,869 A | * | 3/1987 | Kaneko et al. | 330/286 |
| 4,672,328 A | * | 6/1987 | Adachi et al. | 330/286 |
| 5,561,397 A | * | 10/1996 | Kumar et al. | 330/295 |

* cited by examiner

*Primary Examiner*—Robert Pascal
*Assistant Examiner*—Henry Choe

(57) ABSTRACT

In a high-frequency circuit having bias lines that cross a microstrip line in a plan view, portions of the bias lines are formed on a reverse side of a substrate without forming, in the microstrip line, capacitors required for separating the bias lines from each other as an independent DC line, thus contributing to miniaturizing the high-frequency circuit.

21 Claims, 4 Drawing Sheets

HIGH-FREQUENCY CIRCUIT

BACKGROUND OF THE INVENTION

1. Field of the Invention

The present invention relates to a high-frequency circuit for use in a low-noise high-frequency amplifier or the like of a satellite broadcasting low-noise block down-converter. The present invention, particularly, relates to a high-frequency circuit having bias lines that cross a microstrip line in a plan view.

2. Description of the Prior Art

A part of a low-noise high-frequency amplifier, used in an LNB (Low-noise Block Down-converter) that receives a signal from a broadcasting satellite or a communications satellite and outputs an intermediate-frequency signal after frequency conversion, is shown in FIG. 5 as an example of a conventional high-frequency circuit. A low-noise high-frequency amplifier 10 of the LNB includes an MIC (Microwave Integrated Circuit) comprising a substrate, microstrip lines 14L and 14R formed thereon, and elements built in the microstrip lines.

After received by an antenna (not illustrated), radio-frequency signals in 12-GHz band in the form of a left-handed polarized wave and a right-handed polarized wave are fed to the microstrip lines 14L and 14R respectively through input terminals 11L and 11R thereof.

The input signal in the form of a left-handed polarized wave fed through the input terminal 11L is outputted from an output terminal 12L after having been amplified by two amplifiers 13L1 and 13L2, both of which are built in the microstrip line 14L. The input signal in the form of a right-handed polarized wave fed through the input terminal 11R is outputted from an output terminal 12R after having been amplified by two amplifiers 13R1 and 13R2, both of which are built in the microstrip line 14R.

Each of the amplifiers 13L1, 13L2, 13R1, and 13R2 comprises a GaAsFET (Gallium Arsenide Field-Effect Transistor). Between the amplifiers 13L1 and 13L2 in the microstrip line 14L is formed a coupling capacitor C0 so as to prevent DC (Direct Current) current from passing therethrough.

The amplifiers 13L1 and 13L2 are designed to amplify a signal fed to a gate G thereof and to output the signal from a drain D when, for example, bias voltages −B1 and +B1 are applied to the gate G and the drain D via bias lines 16L1 and 16L2 respectively. In this case, a source of the GaAsFET is connected to ground (not illustrated).

Coupling capacitors C1 to C5 are formed in the microstrip line 14R to separate the bias lines 16L1, 16L2, 16R1, and 16R2 from each other as an independent DC line. The amplifiers 13R1 and 13R2 are designed to amplify a signal fed to the gate G thereof and to output the signal from the drain D when, for example, bias voltages −B2 and +B2 are applied to the gate G and the drain D respectively. In this case, the source of the GaAsFET is connected to ground (not illustrated).

However, according to the aforementioned low-noise high-frequency amplifier 10, the microstrip lines 14L and 14R formed on the substrate are made thin and, in addition, a width W thereof is also made small so as to increase overall packaging density. As a result, facing electrodes of each capacitor should be made longer in the longitudinal direction of the microstrip line 14R so that each of the capacitors C1 to C5 gains a sufficient facing area for having a specified capacitance.

The longer microstrip line 14R becomes, the more apart the bias lines 16L1 and 16L2 are spaced out from each other. Consequently, the overall length of the microstrip line 14L becomes longer, resulting in an unduly larger low-noise high-frequency amplifier 10 in size. A similar drawback is also seen even in the case where the capacitors C1 to C5 can be formed without elongating the facing electrodes thereof in the longitudinal direction of the microstrip line 14R, because the gaps lying between the facing electrodes of the capacitors are added up to an existing length thereof.

Although it is not illustrated, in order to prevent the bias lines from crossing one of the microstrip lines on an obverse side of the substrate, the bias lines should be routed in two directions, one from upper side and the other from lower side of the substrate (FIG. 5). Accordingly, components mounted on the substrate for supplying the bias voltage occupy at least two areas, resulting in an unduly large circuit in size. If the bias lines are routed parallel to the microstrip lines, the components for supplying the bias voltage should be mounted at either left or right side, or both (FIG. 5), resulting in an unduly long high-frequency circuit in longitudinal direction. Therefore, it is a common practice to design a high-frequency circuit having bias lines that cross a microstrip line. As a result, not only such a circuit as the aforementioned low-noise high-frequency amplifier 10 but also any high-frequency circuit having bias lines that cross a microstrip line requires capacitors that separate each bias line as an independent DC line, thereby making the high-frequency circuit still unduly large in size.

SUMMARY OF THE INVENTION

An object of the present invention is to provide a high-frequency circuit that can be made compact even in the case where bias lines cross a microstrip line in a plan view.

To achieve the above object, according to one aspect of the present invention, a high-frequency circuit comprises a substrate having an electronic component on an obverse side thereof, a microstrip line formed on the obverse side of the substrate, and one or more bias lines connected to the electronic component on the obverse side of the substrate and formed on a reverse side of the substrate so as to cross the microstrip line in a plan view, wherein the bias lines supply bias voltages to the electronic component.

In this structure, the bias line lying on the reverse side of the substrate and crossing the microstrip line in a plan view, is insulated therefrom and supplies bias voltages to the electronic component.

According to another aspect of the present invention, in a high-frequency circuit as described above, as the bias line, a plurality of bias lines are formed so as to cross, in a plan view, a single conductor formed as the microstrip line.

According to still another aspect of the present invention, in a high-frequency circuit as described above, a direction of current passing through any one of the bias lines is opposite to a direction of current passing through the adjacent bias line.

According to still another aspect of the present invention, in a high-frequency circuit as described above, a filter is connected to the bias lines.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
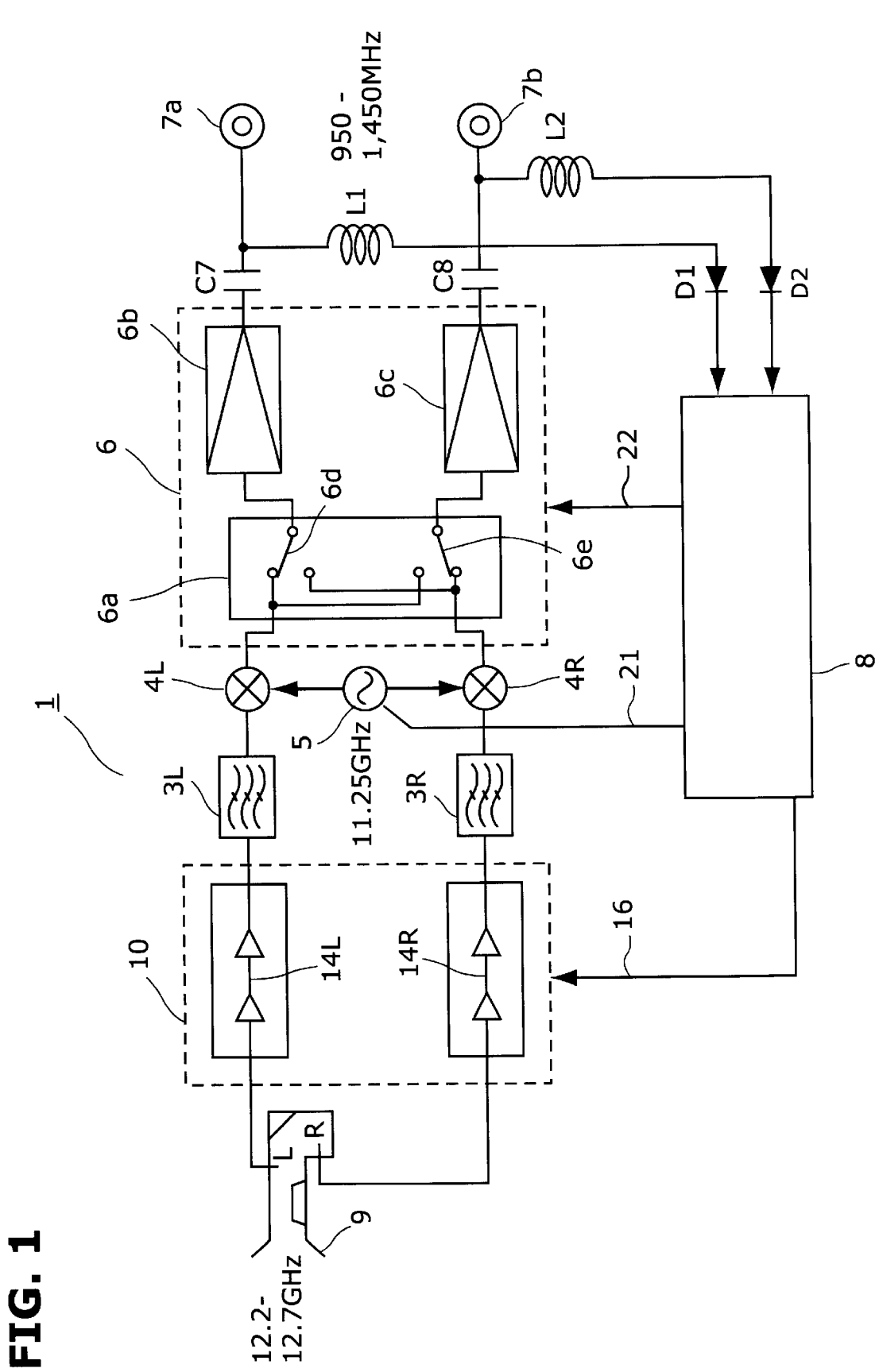
FIG. 1 is a schematic diagram showing an LNB having a low-noise high-frequency amplifier of a first embodiment of the invention.

Hereinafter, embodiments of the present invention will be described with reference to the accompanying drawings. In FIGS. 1 to 4, such components as are found also in FIG. 5 are identified with the same reference numerals.

FIG. 1 is a schematic diagram showing an LNB (low-noise block down-converter) having a low-noise high-frequency amplifier of a first embodiment. An LNB 1 comprises a feeder horn 9, a low-noise high-frequency amplifier 10, band-pass filters 3L and 3R, mixers 4L and 4R, a local oscillator 5, a first intermediate-frequency amplifier 6, and a controller 8. Radio-frequency signals in 12.2-GHz to 12.7-GHz band consisting of a left-handed polarized wave and a right-handed polarized wave are received by the feeder horn 9 and amplified respectively by the low-noise high-frequency amplifier 10.

The amplified signals are fed to the mixers 4L and 4R through the band-pass filters 3L and 3R that allow signals of specific frequencies to pass through. The mixers 4L and 4R convert the signals into IF (Intermediate Frequency) signals of frequencies ranging from 950 MHz to 1,450 MHz based on a local frequency of 11.25 GHz generated by the local oscillator 5.

A switch block 6a in the first intermediate-frequency amplifier 6 is controlled by the controller 8 and selects the IF signals of the left-handed polarized wave or the right-handed polarized wave. An amplifier 6b in the first intermediate-frequency amplifier 6 amplifies the IF signals selected by a switch circuit 6d. An amplifier 6c amplifies the IF signals selected by a switch circuit 6e. The amplified signals are then outputted to output terminals 7a and 7b after passing through coupling capacitors C7 and C8 respectively.

The output terminals 7a and 7b receive DC voltage from a tuner circuit (not illustrated) respectively. One ends of choke coils L1 and L2 are connected to the output terminals 7a and 7b respectively and the other ends to anodes of diodes D1 and D2 respectively. Cathodes of the diodes D1 and D2 are connected to the controller 8. The controller 8, according to the DC voltage supplied thereto, supplies power to the low-noise high-frequency amplifier 10, the local oscillator 5, and the first intermediate-frequency amplifier 6 via bias lines 16, 21, and 22 respectively.

Figure 2:
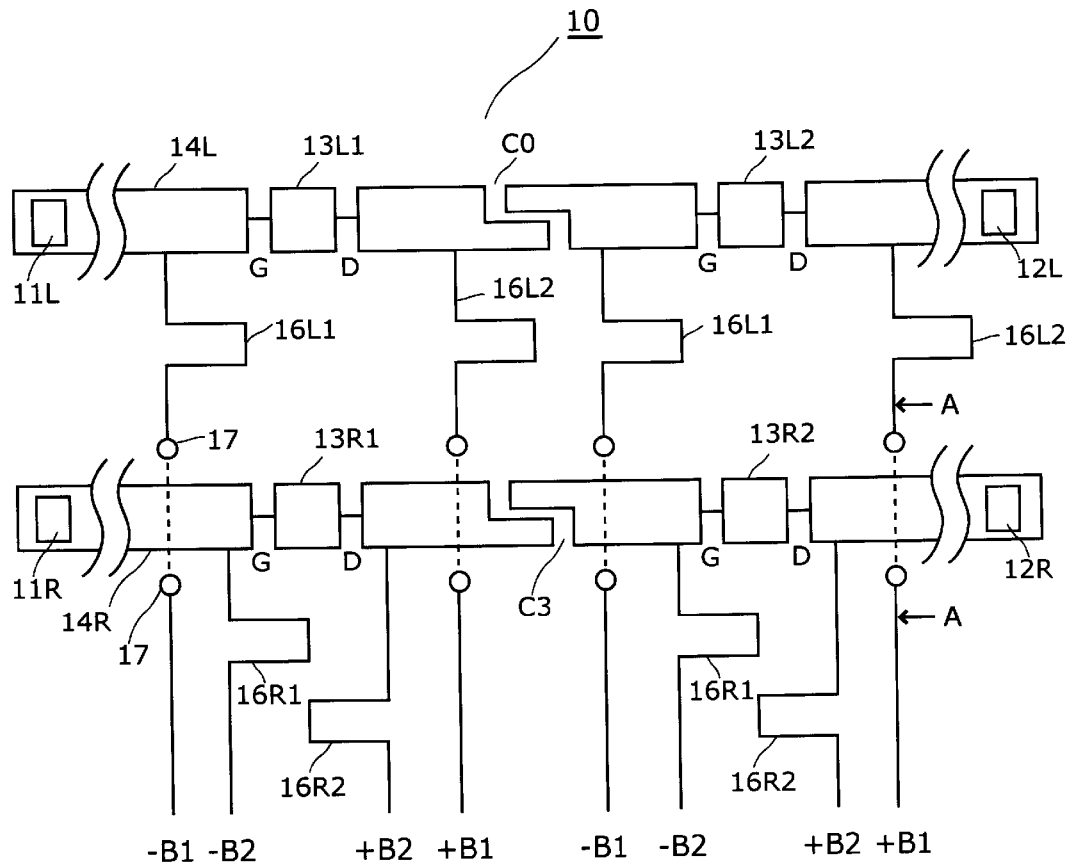
FIG. 2 is a schematic diagram showing the low-noise high-frequency amplifier of the first embodiment.

FIG. 2 is a schematic diagram showing the low-noise high-frequency amplifier. After received by the feeder horn (FIG. 1), 12-GHz band radio frequency signals in the form of a left-handed polarized wave and a right-handed polarized wave are fed to microstrip lines 14L and 14R respectively via input terminals 11L and 11R thereof.

The input signal in the form of a left-handed polarized wave that is fed through the input terminal 11L is outputted from an output terminal 12L after having been amplified by two amplifiers 13L1 and 13L2 built in the microstrip line 14L. The input signal in the form of a right-handed polarized wave that is fed through the input terminal 11R is outputted from an output terminal 12R after having been amplified by two amplifiers 13R1 and 13R2 built in the microstrip line 14R.

Each of the amplifiers 13L1, 13L2, 13R1, and 13R2 comprises a GaAsFET (Gallium Arsenide Field-Effect Transistor). Between the amplifiers 13L1 and 13L2 in the microstrip line 14L is formed a coupling capacitor C0 so that DC current does not pass therethrough. At the same time, between the amplifiers 13R1 and 13R2 in the microstrip line 14R is formed a coupling capacitor C3 so that DC current does not pass therethrough.

The amplifiers 13R1 and 13R2 are designed to amplify a signal fed to a gate G thereof and to output the signal from a drain D when, for example, bias voltages −B2 and +B2 are applied to the gate G and the drain D via bias lines 16R1 and 16R2 respectively. In this case, a source of the GaAsFET is connected to ground (not illustrated).

Figure 3:
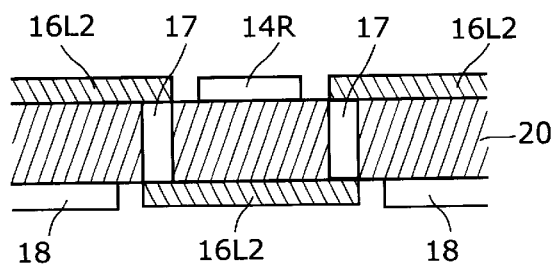
FIG. 3 is a diagram showing a cross section of A—A shown in FIG. 2.

The bias lines 16L1 and 16L2 are configured to cross the microstrip line 14R in a plan view. FIG. 3 is a diagram showing a cross section of A—A shown in FIG. 2. The microstrip line 14R is formed on an obverse side of a substrate 20. On the obverse side of the substrate 20 are formed the bias lines 16L1 and 16L2 whose portions are also formed on a reverse side of the substrate 20 so as to cross the microstrip line 14R in a plan view. The bias lines 16L1 and 16L2 formed on the obverse side of the substrate are connected continuously to the portions thereof formed on the reverse side of the substrate 20 via through holes 17 respectively.

In this configuration, the amplifiers 13L1 and 13L2 amplify a signal fed to the gate G thereof and output the signal from the drain D when, for example, bias voltages −B1 and +B1 are applied to the gate G and the drain D via the bias lines 16L1 and 16L2 respectively.

In FIG. 3, a numeral 18 is a conductor layer formed over almost an entire reverse side of the substrate 20. However, it should be noted that the conductor layer is not formed to cover the bias lines 16L1 and 16L2 and edges thereof that are formed on the reverse side of the substrate 20.

In this embodiment, contrary to a conventional circuit as shown in FIG. 5, it is not required to form capacitors C1, C2, C4, and C5 by segmenting the microstrip line 14R so as to separate each bias line from each other as an independent DC line even in the case where the bias lines 16L1 and 16L2 are arranged to cross the microstrip line 14R in a plan view.

The microstrip line 14R thus can be shortened, making it also possible to shorten the overall length of the microstrip line 14L because the distance between the bias lines 16L1 and 16L2 becomes smaller. This contributes to miniaturizing the low-noise high-frequency amplifier 10 comprising an MIC.

Figure 4:
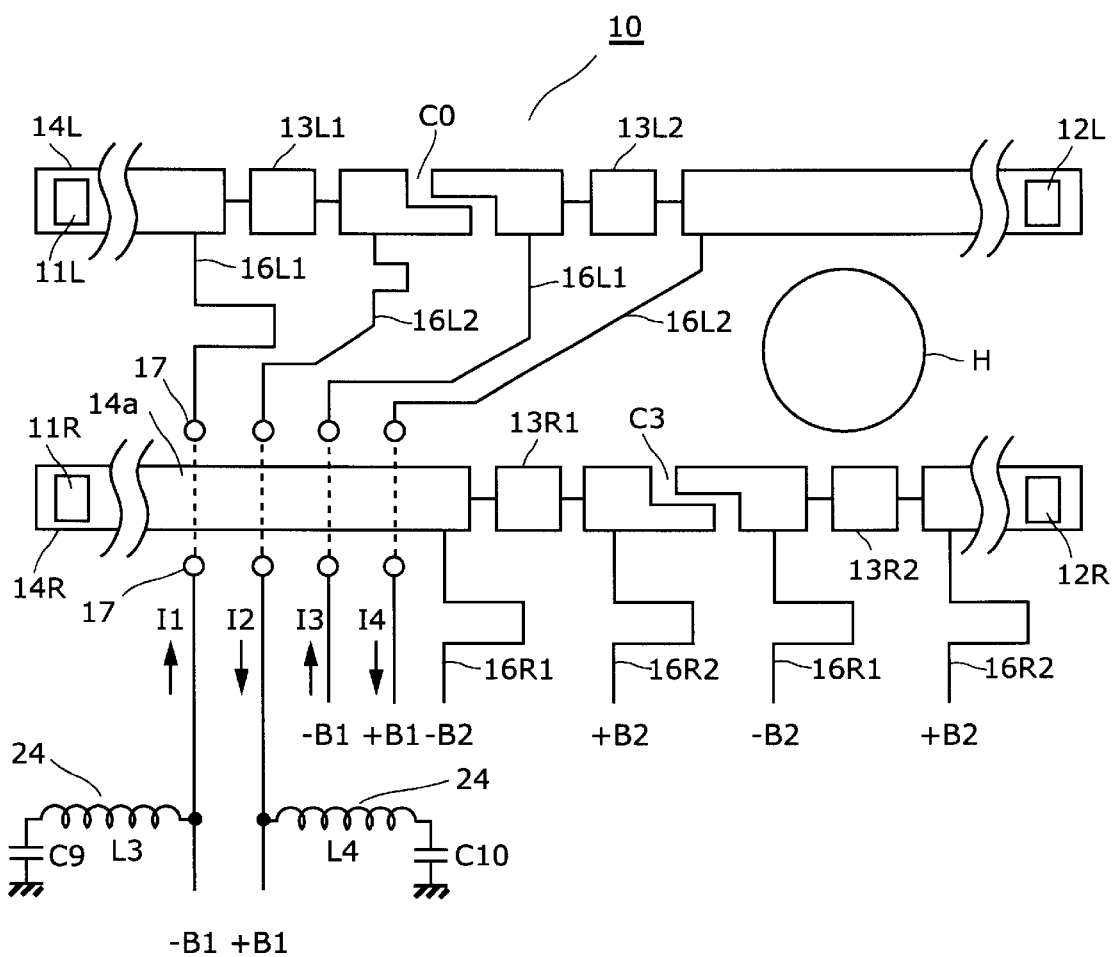
FIG. 4 is a schematic diagram showing a low-noise high-frequency amplifier of a second embodiment.
Figure 5:
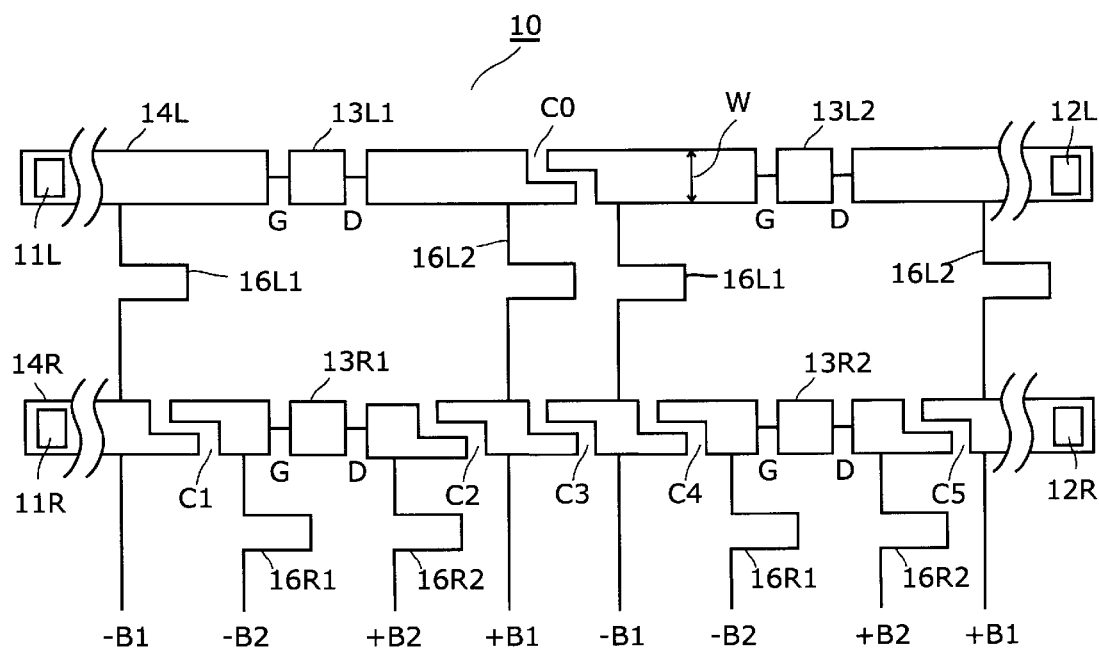
FIG. 5 is a schematic diagram showing a conventional low-noise high-frequency amplifier.

FIG. 4 is a schematic diagram showing a low-noise high-frequency amplifier of a second embodiment. A low-noise high-frequency amplifier 10 in this embodiment functions in the same manner as that in the first embodiment as shown in FIG. 2 as previously described. Amplifiers 13L1 and 13L2 built in a microstrip line 14L receive bias voltages through bias lines 16L1 and 16L2.

The bias lines 16L1 and 16L2 are connected to a reverse side of a substrate 20 (FIG. 3) via through holes 17 as is the case in the first embodiment. In this case, four bias lines 16L1 and 16L2 cross, in a plan view, a single conductor 14a formed as a microstrip line 14R. In this arrangement, it is possible to secure a wide area H on the obverse side of the substrate as shown in FIG. 4. As a result, it is possible to mount other electronic components in this area H, contributing to realizing high-density packaging of the low-noise high-frequency amplifier 10. It is to be noted that portions of the bias lines 16L1 and 16L2 are laid in an oblique angle so that the bias lines will be equal in length.

As shown by arrows and numerals I1 to I4 in FIG. 4, a direction of current passing through any one of the bias lines 16L1 and 16L2 is opposite to a direction of current passing through the adjacent bias line. In this arrangement, magnetic fields generated by the currents I1 to I4 passing through the bias lines 16L1 and 16L2 cancel each other, resulting in a reduction in the magnetic fields affecting the microstrip line 14R.

Another adverse effect that may influence other circuits is caused by signals being transferred from the microstrip line 14R to the bias lines 16L1 and 16L2 formed on the reverse side of the substrate 20. To overcome this, filters 24 including coils L3 and L4, and capacitors C9 and 10 are connected to the bias lines 16L1 and 16L2 respectively so as to remove the transferred signals and alleviate the adverse effect that will otherwise influence the other circuits.

Although the first and second embodiments deal with a low-noise high-frequency amplifier for use in an LNB, for achieving similar effects, the present invention is applicable also to high-frequency circuits having a circuit layout in which bias lines cross microstrip lines.

According to the present invention, in the case where bias lines are arranged to cross a microstrip line in a plan view, coupling capacitors to segment the microstrip line for separating each bias line as an independent DC line are not required as in the conventional case if portions of the bias lines are formed on a reverse side of a substrate. Consequently, the mictostrip line can be made so shorter that the bias lines can be arranged closer to each other, contributing to miniaturizing a high-frequency circuit.

Moreover, according to the present invention, distances between the bias lines can be made smaller because a plurality of bias lines are formed so as to cross, in a plan view, a single conductor formed as a microstrip line. In this arrangement, a wide area for mounting other electronic components can be secured in the high-frequency circuit for realizing a high-density packaging of high-frequency circuits.

Furthermore, according to the present invention, a direction of current passing through any one of the bias lines is opposite to a direction of current passing through the adjacent bias line. In this arrangement, magnetic fields generated by the currents passing through the bias lines cancel each other, resulting in a reduction in the magnetic fields affecting the microstrip lines.

Moreover, according to the present invention, an adverse effect, that may otherwise influence other circuits and is caused by signals being transferred from the microstrip lines to the bias lines formed on the reverse side of the substrate, is reduced by connecting filters to the bias lines.

What is claimed is:

1. A high-frequency circuit comprising:
    a substrate having an electronic component on an obverse side thereof;
    a microstrip line formed on the obverse side of the substrate;
    one or more bias lines connected to the electronic component on the obverse side of the substrate and formed on a reverse side of the substrate so as to cross the microstrip line in a plan view,
    wherein the bias lines supply bias voltages to the electronic component.

2. A high-frequency circuit as claimed in claim 1,
    wherein, as the bias line, a plurality of bias lines are formed so as to cross, in a plan view, a single conductor formed as the microstrip line.

3. A high-frequency circuit as claimed in claim 2,
    wherein a direction of current passing through any one of the bias lines is opposite to a direction of current passing through the adjacent bias line.

4. A high-frequency circuit as claimed in claim 2,
    wherein a filter is connected to the bias lines.

5. A high-frequency circuit for use in a receiver converter, comprising:
    a substrate;
    two microstrip lines formed on an obverse side of the substrate;
    first electronic components built in one of the microstrip lines;
    second electronic components built in the other microstrip line; and
    a plurality of bias lines connected to the first electronic components on the obverse side of the substrate and formed continuously on the obverse side and a reverse side of the substrate so as to cross, on the reverse side of the substrate in a plan view, the microstrip line in which the second electronic components are built,
    wherein the bias lines supply bias voltages to the first electronic components.

6. A high-frequency circuit for use in a receiver converter as claimed in claim 5,
    wherein portions of the bias lines are formed on the reverse side of the substrate so as to cross, in a plan view, a single conductor formed as one of the microstrip lines which the second electronic components are built in.

7. A high-frequency circuit for use in a receiver converter as claimed in claim 6,
    wherein a direction of current passing through any one of the bias lines is opposite to a direction of current passing through the adjacent bias line.

8. A high-frequency circuit for use in a receiver converter as claimed in claim 6,
    wherein a filter is connected to the bias lines.

9. A high-frequency circuit for use in a receiver converter as claimed in claim 5,
    wherein the bias lines are formed continuously with portions thereof lying on the obverse side and the reverse side of the substrate connected together via through holes.

10. A high-frequency circuit for amplifying two differently polarized waves, comprising:
    a substrate;
    a first microstrip line formed on an obverse side of the substrate for transmitting a first polarized wave;
    a second microstrip line formed on the obverse side of the substrate for transmitting a second polarized wave;
    first amplifiers built in the first microstrip line;
    second amplifiers built in the second microstrip line;
    a plurality of first bias lines connected to the first amplifiers on the obverse side of the substrate for supplying bias voltages thereto and formed continuously on the obverse side and a reverse side of the substrate so as to cross, in a plan view, the second microstrip line on the reverse side of the substrate; and a plurality of second bias lines connected to the second amplifiers on the obverse side of the substrate for supplying bias voltages thereto and formed on the obverse side of the substrate so as not to cross, in a plan view, the second microstrip line.

11. A high-frequency circuit for amplifying two differently polarized waves as claimed in claim 10, wherein portions of the first bias lines are formed on the reverse side of the substrate so as to cross, in a plan view, a single conductor formed as the second microstrip line.

12. A high-frequency circuit for amplifying two differently polarized waves as claimed in claim 11, wherein a direction of current passing through any one of the first and second bias lines is opposite to a direction of current passing through the adjacent bias line.

13. A high-frequency circuit for amplifying two differently polarized waves as claimed in claim 11, wherein a filter is connected to the first bias lines.

14. A high-frequency circuit for amplifying two differently polarized waves as claimed in claim 10, wherein the first bias lines are formed continuously with portions thereof lying on the obverse side and the reverse side of the substrate connected together via through holes.

15. A high-frequency circuit for use in a receiver converter, comprising:

a substrate having a conductor layer formed over almost an entire reverse side thereof;

a first microstrip line formed on an obverse side of the substrate for transmitting a first signal and segmented with a capacitor formed in between so that DC current does not pass therethrough;

a second microstrip line formed almost parallel to the first microstrip line on the obverse side of the substrate for transmitting a second signal and segmented with a capacitor formed in between so that DC current does not pass therethrough;

first amplifiers built in the first microstrip line;

second amplifiers built in the second microstrip line;

a plurality of first bias lines having one end connected to the first amplifiers on the obverse side of the substrate for supplying bias voltages thereto and formed continuously on the obverse side and a reverse side of the substrate so as to cross, in a plan view, the second microstrip line on the reverse side of the substrate; and a plurality of second bias lines having one end connected to the second amplifiers on the obverse side of the substrate for supplying bias voltages thereto and formed on the obverse side of the substrate so as not to cross, in a plan view, the second microstrip line, wherein other ends of the first and second bias lines are located in a region on an opposite side of the second microstrip line to the first microstrip line on the obverse side of the substrate.

16. A high-frequency circuit for use in a receiver converter as claimed in claim 15, wherein portions of the first bias lines are formed on the reverse side of the substrate so as to cross, in a plan view, a single conductor formed as the second microstrip line.

17. A high-frequency circuit for use in a receiver converter as claimed in claim 16, wherein a direction of current passing through any one of the first and second bias lines is opposite to a direction of current passing through the adjacent bias line.

18. A high-frequency circuit for use in a receiver converter as claimed in claim 16, wherein a filter is connected to the first bias lines.

19. A high-frequency circuit for use in a receiver converter as claimed in claim 15, wherein the first bias lines are formed continuously with portions thereof lying on the obverse side and the reverse side of the substrate connected together via through holes.

20. A microwave integrated circuit for use in a receiver converter, comprising:

a substrate having a conductor layer formed over almost an entire reverse side thereof;

a first microstrip line formed on an obverse side of the substrate for transmitting a first signal and segmented with a capacitor formed in between so that DC current does not pass therethrough;

a second microstrip line formed almost parallel to the first microstrip line on the obverse side of the substrate for transmitting a second signal and segmented with a capacitor formed in between so that DC current does not pass therethrough;

first amplifiers comprising a GaAsFET, built in the first microstrip line for amplifying the first signal;

second amplifiers comprising a GaAsFET, built in the second microstrip line for amplifying the second signal;

a plurality of first bias lines formed continuously on the obverse and reverse sides of the substrate, the first bias lines being formed continuously with portions thereof lying on the obverse side and the reverse side of the substrate connected together via through holes;

having portions thereof that cross the second microstrip line in a plan view, are formed on the reverse side of the substrate;

having one end thereof connected to the first amplifiers on the obverse side of the substrate;

having the other end thereof located in a region on an opposite side of the second microstrip line to the first microstrip line on the obverse side of the substrate; and supplying bias voltages to the first amplifiers, a plurality of second bias lines formed continuously on the obverse side of the substrate, the second bias lines having one end thereof connected to the second amplifiers on the obverse side of the substrate;

having the other end thereof located in the same region as the other end of the first bias lines; and supplying bias voltages to the second amplifiers, a filter connected to the first bias lines.

21. A microwave integrated circuit for use in a receiver converter as claimed in claim 20, wherein portions of the first bias lines are formed on the reverse side of the substrate so as to cross, in a plan view, a single conductor formed as the second microstrip line, and a direction of current passing through any one of the first and second bias lines is opposite to a direction of current passing through the adjacent bias line.

* * * * *